United States Patent [19]
Arai

[11] Patent Number: 5,756,378
[45] Date of Patent: May 26, 1998

[54] METHOD OF AND APPARATUS FOR LASER PROCESSING

[75] Inventor: Kunio Arai, Atsugi, Japan

[73] Assignee: Hitachi Seiko Ltd., Ebina, Japan

[21] Appl. No.: 604,809

[22] Filed: Feb. 23, 1996

[51] Int. Cl.[6] ................................................. H01L 21/60
[52] U.S. Cl. ........................ 438/125; 438/691; 257/700
[58] Field of Search ................................... 457/203, 217,
457/235, 173; 219/121.71, 121.72; 257/774,
700; 438/125, 690, 691

[56] References Cited

U.S. PATENT DOCUMENTS

| | | |
|---|---|---|
| 4,323,755 | 4/1982 | Nierenberg . |
| 4,504,727 | 3/1985 | Melcher et al. . |
| 4,644,130 | 2/1987 | Bachmann . |
| 4,673,409 | 6/1987 | Van Kampen . |
| 5,010,232 | 4/1991 | Arai et al. . |
| 5,483,100 | 1/1996 | Marrs et al. . |

FOREIGN PATENT DOCUMENTS 2-262941  10/1990  Japan .

*Primary Examiner*—John Niebling
*Assistant Examiner*—Kevin F. Turner
*Attorney, Agent, or Firm*—Antonelli, Terry, Stout, & Kraus, LLP

[57] ABSTRACT

The disclosure relates to spot-facing for exposing an inner-layer conductor embedded in an insulator of a printed circuit board. The spot-facing removes the entire insulator by a mechanical cutter, except a part thereof, to a position just above the inner-layer conductor. The part of the insulator is smaller in thickness than the insulator removed by the mechanical cutter. Then, the remaining part of the insulator is removed by scanning the part with a laser beam to expose the inner-layer conductor. The laser beam is in a slender shape almost perpendicular to the scanning direction of the laser beam and has an almost uniform energy density along the slender shape. Cutter processing is sufficient to be done before the inner-layer conductor, and there is no fear of damaging the inner-layer conductor. Moreover, laser-beam processing is easy to control thermal influence on the portion to be processed of the circuit board, because the energy density of the laser beam is almost uniform. Therefore, the product yield according to the processing is improved.

15 Claims, 12 Drawing Sheets

5,756,378

METHOD OF AND APPARATUS FOR LASER PROCESSING

BACKGROUND OF THE INVENTION

The present invention relates to laser-beam machining or processing of a printed circuit board. More particularly, the invention relates to improvement of the method and the apparatus disclosed in U.S. Pat. No. 5,010,232. The patent was issued to the inventor of the present invention and to another on Apr. 23, 1991.

The density of an integrated circuit is increased and coincidentally, the number of external connection terminals per integrated circuit is also steadily increased. A printed circuit board for mounting of high-density electronic parts or devices with a lot of external connection terminals cannot be provided with a necessary number of external connection terminals by the conventional planar mounting method in which lead connection terminal pads are arranged in a row around a mounted part on an outer layer of the circuit board. In such a printed circuit board, it is necessary to decrease the width of each connection terminal and the connection terminal interval, which will be referred to as pitch decreasing hereafter. Moreover, it is required to provide connection terminals not only on the outer layer but also on an inner layer of the circuit board. Several types of spot facing methods have conventionally been known, which are performed to expose the inner layer of a printed circuit board. For example, there is a method of directly applying a laser beam to insulating layers of the circuit board. This method exposes a target inner copper-foil layer by removing all the insulating layers between the outer layer surface and the inner layer by a laser beam. Moreover, there is a method as disclosed in Japanese Patent Unexamined Publication No. 2-262941. According to this method, an inner copper foil is exposed by mechanically detecting a substrate surface position to obtain a substrate thickness error and by carrying out spot facing up to a predetermined depth by a cutter of Z axis of the main axis in accordance with constant-rate-corrected inner-layer positional data.

U.S. Pat. No. 5,010,232 discloses a bottomed-hole forming method which is performed utilizing cutting and laser-beam processing in combination. First, an outer copper foil, copper foil layers and insulating layers are removed by a cutter to an extent immediately before a target inner copper foil. The remaining insulating layer is then removed by a laser beam to expose the target inner copper foil.

To decrease the widths of patterns and achieve the pitch decreasing in a printed circuit board, a thinner copper-foil layer is more advantageous because the resolution is improved when forming a pattern. A printed circuit board is formed by heat-pressing and laminating several to tens of plates in a laminating process. In the heat-pressing process, a resin flows out of peripheral ends of the printed circuit board. Therefore, the plate thickness at the peripheral ends tends to be thinner, up to approx. 0.1 mm, than the thickness at the central portion. Moreover, where of an insulating layer between copper-foil layers has a thickness of 0.1–0.2 mm, an error in this thickness can reach approx. 0.03 mm (30 µm), and the yield of products is greatly decreased when performing spot facing directly by a cutter. Accordingly, it cannot be avoided to set the thickness of an inner copper-foil layer to 60 µm in view of the fluctuation of 30 µm of the layer thickness and thus, it is impossible to form a thin pattern.

When processing a printed circuit board directly by a laser-beam machining method, insulating layers which are made of a resin and glass-fiber cloth and have a thickness of up to 1 mm have to be removed. A high-output energy density is necessary to remove the resin and glass-fiber cloth and the removal depth per pulse is approx. 1 µm at most. Therefore, to finish a square with one side of 20 mm or an area of 400 mm$^2$, irradiation of total of a 20,000 pulses is required even when using an excimer laser beam of the following specifications. That is, in this laser beam, the high output is reduced to ⅕, in other words, the irradiation area is expanded up to 5 times, the simultaneous perforation area is 5 mm×4 mm or 20 mm$^2$, the beam output at the exit of a generator is 500 mJ/cm$^2$, and the beam size is 5 mm×20 mm. If the printed circuit board is processed at a pulse frequency of 100 Hz and has a relatively small influence of heat, the processing time of at least 200 sec is necessary. Moreover, because the copper foil surface is greatly oxidized and the resin at a boundary of the processed area is greatly carbonized, the printed circuit board is not finished for practical use. The method disclosed in Japanese Patent Unexamined Publication No. 2-262941 detects the height of the surface of a printed circuit board and corrects the plate thickness error. However, because the cutting depth easily becomes excessively large when the printed circuit board is perforated at a time, the method requires two processes of roughing and finishing. Furthermore, there are cases where printed circuit board surface detection and finishing are inevitably repeated. Therefore, the time of completion of spot facing becomes too long and, for example, it takes 90 to 150 sec to finish a 20 mm-square. Conventionally, the roughing rate of a 2.0 mm-cutter is 2.0 m/sec and the finishing rate thereof is 0.5 m/sec. However, it is difficult to uniformly finish a spot-faced portion due to fluctuation of the depth of an inner layer and inclination of the inner layer. There is a possibility that, depending on the setting of a cutting depth, a residual portion which cannot be perforated at all will be produced or the inner layer will be cut off in a printed circuit board. Further, a cutter when abraded may cause burr or exfoliation in the inner layer of a portion perforated. Therefore, the yield of products decreases and moreover, the running cost is large because the cutter end is greatly abraded due to cutting of the copper foil of the inner layer.

The method of U.S. Pat. No. 5,010,232 assumes that the processing with a cutter and a laser beam is performed before plating, patterning and solder-masking processes. When performing the spot facing before the plating, patterning and solder-masking processes, a practical difficulty is involved because it is required to prevent solder from attaching to a spot-faced portion and to protect the portion from etching. Therefore, it is necessary to provide a processing method with a high reliability which can be executed after plating, patterning, and solder-masking.

SUMMARY OF THE INVENTION

The present invention has an object of providing a method which can spot-face a printed circuit board at a high productivity while solving the above-described problems of error due to cutter processing and heat influence due to a laser beam.

It is another object of the present invention to provide an apparatus for efficiently executing the above processing method.

The invention aims at improving the processing method of the above-referenced U.S. patent, which removes all layers from the surface layer of a printed circuit board up to a position immediately before an inner layer conductor thereof by means of a cutter to leave a part of an insulating layer and then removes the remaining insulating layer by a laser beam to expose the inner layer conductor. The present inventor has made various experiments with this method to analyze the relation between heat influence, shape, and resin thickness of a processed portion. As a result, he has clarified that optimum perforation with least heat influence can be obtained by applying a laser as an elongated or slender pulse beam across the scanning direction. Moreover, in addition to use of the slender beam, by setting a mask with proper dimensions on the portion of a printed circuit board to be processed and applying the laser beam through the mask, it is possible to form a sharp processing boundary.

Because a high-density electronic part produces much heat, it is effective for heat radiation to bring the part into contact, in an area as wide as possible, with an inner layer conductor or copper layer, and therefore, it is necessary to expose a copper foil inside of the mounting surface of the printed circuit board. Moreover, it is effective in view of external noises to form a shield layer nearby the high-density part when mounting the part on the printed circuit board, and it is effective for stabilization of signals to form the shield layer on the bottom of the device.

An aspect of the present invention is directed to a method of spot-facing a printed circuit board, which has an insulator and at least one conductor inner layer embedded in the insulator, to expose the inner layer conductor. This method comprises the steps of removing the insulator up to a position just above the inner layer conductor by a mechanical cutter to leave a part of the insulator above the inner layer conductor and then removing the remaining part of the insulator by scanning the part with a laser beam to expose the inner layer conductor. The remaining part of the insulator has a thickness smaller than that of the insulator removed by the mechanical cutter. The laser beam has a slender (elongated) shape substantially perpendicular to the scanning direction of the laser beam and has an almost uniform energy density along the slender shape.

The processing apparatus according to another aspect of the present invention comprises at least one mechanical processing head including a mechanical cutter, at least one laser-beam processing head movable with respect to a printed circuit board, and a controller operatively connected to the mechanical processing head and the laser-beam processing head. The mechanical cutter is movable into contact with or away from the printed circuit board. The laser-beam processing head includes an optical system capable of emitting a laser beam which has an elongated or slender shape and is almost uniform in energy density along its slender shape. The controller controls operations of the mechanical processing head and the laser-beam processing head in accordance with inputs to the controller. The apparatus operates in a manner that the insulator of the circuit board is removed to a position just above an inner layer conductor thereof by the mechanical cutter to leave a remaining part of the insulator above the inner layer conductor and the remaining part of the insulator is removed by scanning the part with a laser beam to expose the inner layer conductor. The remaining part of the insulator has a thickness smaller than that of the insulator removed by the mechanical cutter. The laser beam has an elongated or slender shape, and it is emitted in a direction substantially perpendicular to its scanning direction.

The present invention makes it possible to set the cutting depth of cutter processing to a small value in view of the error in position of a target inner layer. Therefore, there is no fear of cutting the inner layer by the cutter at the time of processing even if the position of the inner layer fluctuates in different printed circuit boards. In the subsequent laser-beam processing, the laser beam is reflected from the surface of the metal conductor. For example, the reflectance of a $CO_2$ laser beam with a wavelength of 10.6 µm is approx. 97%, and that of an ultraviolet laser beam with a wavelength of 0.308 µm is 30% or less. By setting the energy density of a laser beam to be emitted as follows, therefore, it is possible to remove the insulating layer without doing substantially any damage to the copper foil, and to increase the reliability of processing to thereby improve the yield of products. That is, it is adequate to set the energy density to a value slightly higher than the decomposition threshold of the resin and glass of the remaining insulating layer and slightly lower than the threshold of copper. Moreover, the dosage of irradiation of the laser beam is set to a value slightly larger than the irradiation dosage necessary for a portion of the remaining insulating layer where a greater amount of the insulating layer is left. Furthermore, it is necessary to select a condition so that the temperature at the back of the copper foil after irradiation with the laser beam is lower than the decomposition temperature of the resin.

BRIEF DESCRIPTION OF DRAWINGS

The above-described and other objects, features and advantages of the present invention will become apparent from the following description taken in conjunction with the appended claims, which description will be made hereafter with reference to the accompanying drawings in which:

DESCRIPTION OF THE PREFERRED EMBODIMENTS

The disclosure of U.S. Pat. No. 5,010,232 referred to above is specifically and totally incorporated herein by reference.

Figure 1:
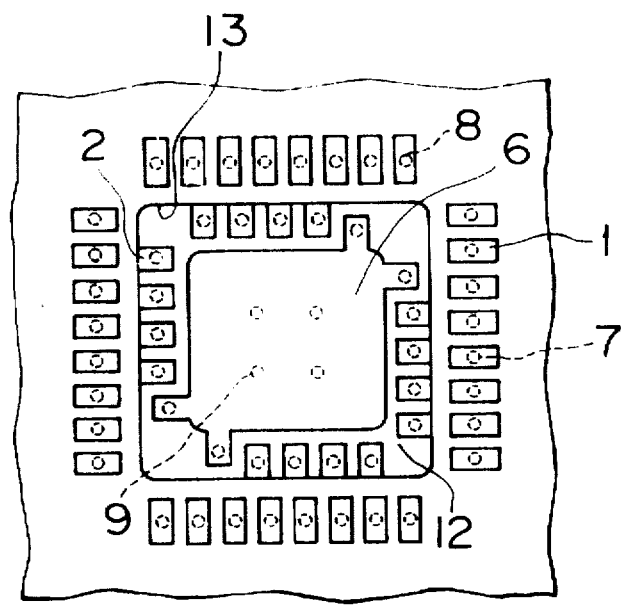
FIG. 1 is a top view showing an essential portion of a printed circuit board spot-faced by the method of the present invention.
Figure 2:
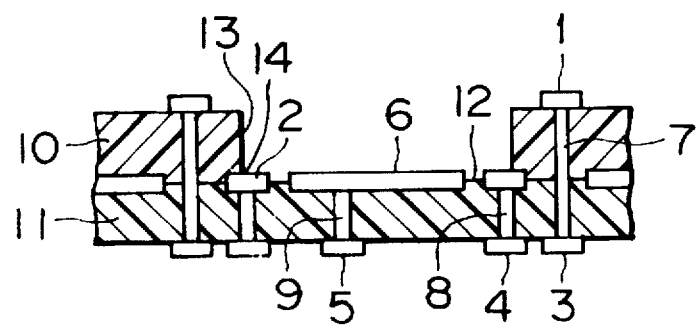
FIG. 2 is a sectional side view of the essential portion of the board in FIG. 1.
Figure 3:
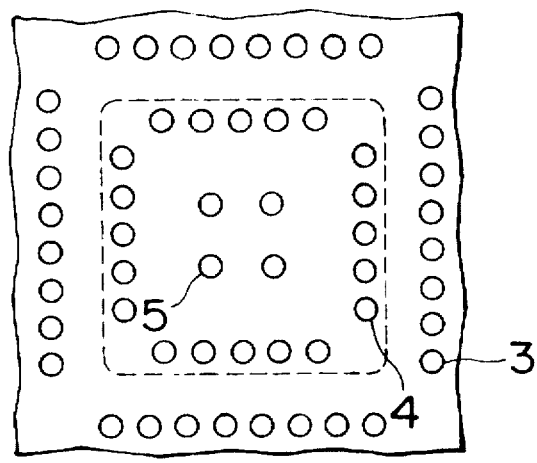
FIG. 3 is a bottom view of the essential portion of the board in FIG. 1.

FIGS. 1 to 3 show the finished shape of a printed circuit board spot-faced according to the present invention. Reference numeral 1 denotes external-connection conductor terminals provided on an outer layer, 2 external-connection conductor terminals provided on an inner layer, 3, 4, and 5 external-connection conductor terminals respectively provided on another outer layer, and 6 a mounting conductor terminal provided on the inner layer and mainly used for both mounting of an LSI chip and earth connection. Reference numeral 7 denotes plated through-holes for connecting the external-connection conductor terminals 1 and 3, and 8 denotes dead-end holes for connecting the external-connection conductor terminals 2 and 4. Reference numeral 9 denotes dead-end holes for connecting the external-connection conductor terminal 5 and the mounting conductor terminal 6. Reference numerals 10 and 11 denote insulating layers for insulating the inner layer from the outer layers, respectively, which insulating layers are made of glass-fiber cloth and a resin.

Figure 4:
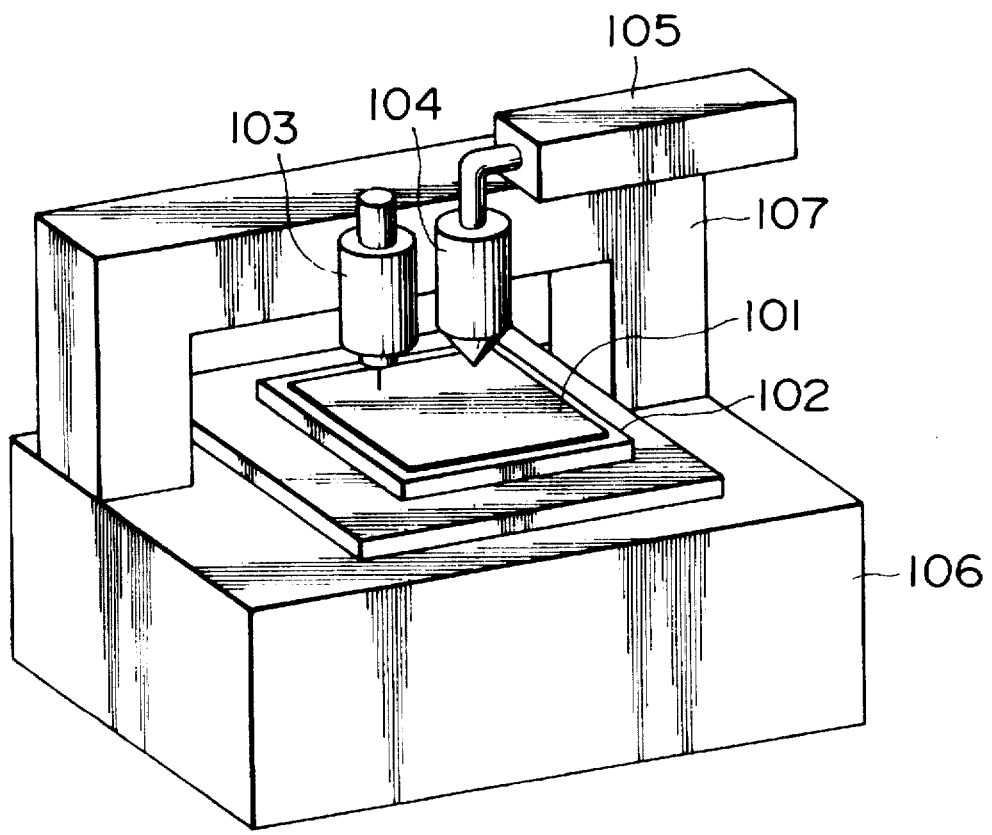
FIG. 4 is a perspective view showing the whole structure of the processing apparatus of an embodiment of the present invention.

FIG. 4 shows the essential structure of a processing apparatus for executing the present invention. In the drawing, reference numeral 101 denotes a printed circuit board, 102 an XY table of the type being driven by a motor, not shown, on which the printed circuit board 101 is set, 103 a cutter spot-facing head, hereafter referred to as a cutter processing head, 104 a laser-beam spot-facing head, hereafter referred to as a laser-beam processing head, 105 a laser generator, and 106 a bed of the apparatus, which serves as a base for mounting the XY table 102, a column 107, the cutter processing head 103, and the laser-beam processing head 104.

Spot-facing of the printed circuit board according to the laser-beam processing method of the present invention will be described below with reference to FIGS. 4 to 12.

Figure 5:
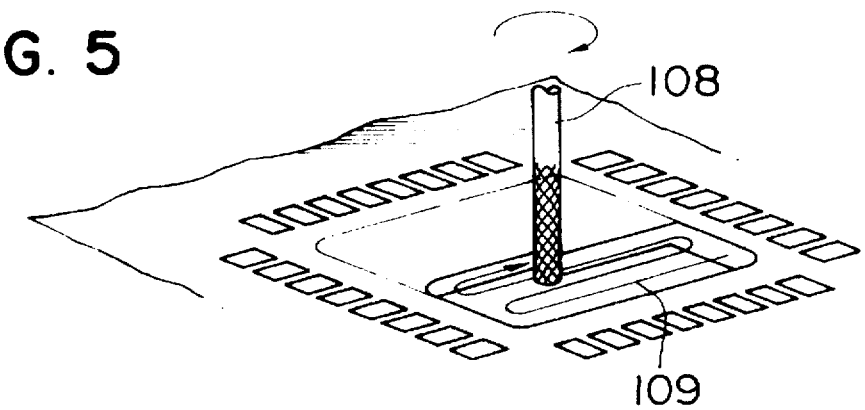
FIG. 5 is a perspective view showing a state of cutter processing according to the method of the present invention.
Figure 6:
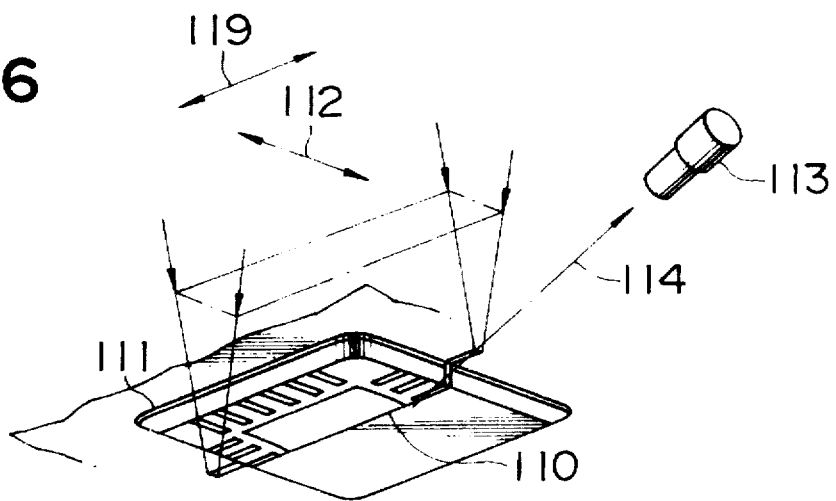
FIG. 6 is a perspective view showing a state of laser-beam processing according to the method of the present invention.
Figure 7:
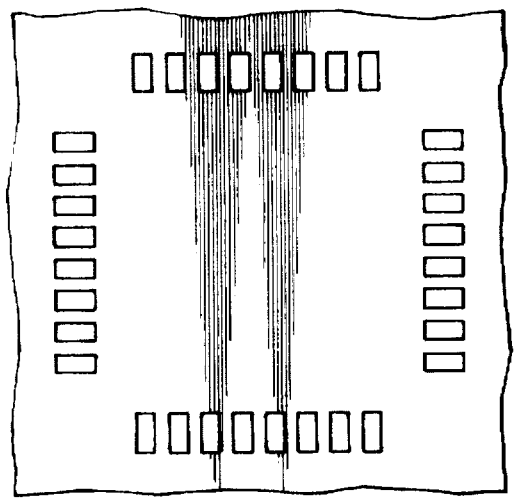
FIG. 7 is a top view showing an essential portion of a printed circuit board to be spot-faced before processing.
Figure 8:
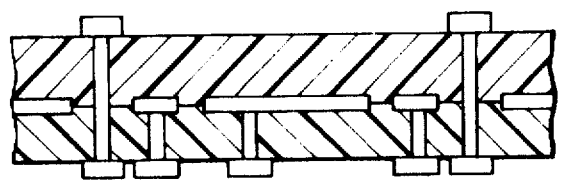
FIG. 8 is a sectional side view of the essential portion of the board in FIG. 7.
Figure 9:
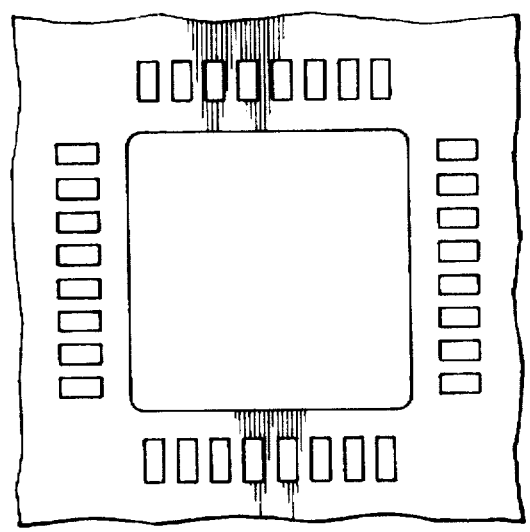
FIG. 9 is a top view showing the essential portion of the board in FIG. 7, after cutter processing according to the method of the present invention.
Figure 10:
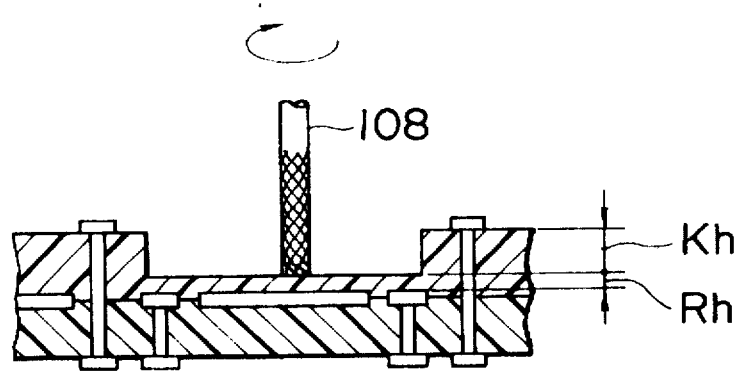
FIG. 10 is a sectional side view of the essential portion of the board in FIG. 9.
Figure 11:
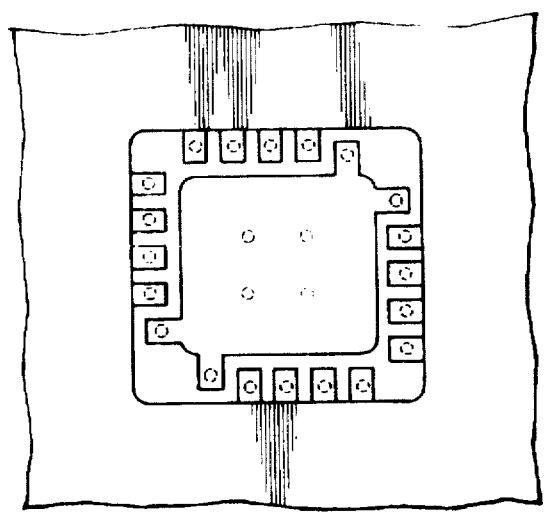
FIG. 11 is a top view showing the essential portion of the board in FIG. 7, after laser-beam processing according to the method of the present invention.
Figure 12:
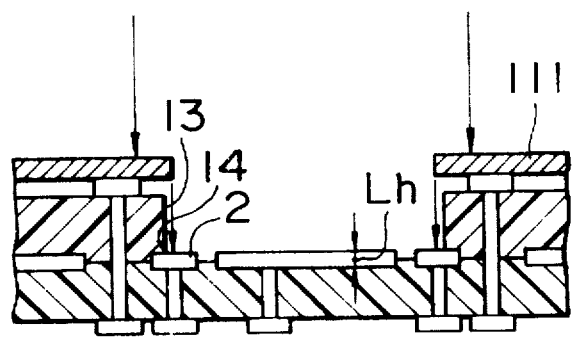
FIG. 12 is a sectional side view of the essential portion of the board in FIG. 11.

The printed circuit board 101 is set on the motor-driven XY table 102, and its portion to be processed or perforated, as shown in FIGS. 7 and 9, is positioned in place for processing by a cutter 108 of the cutter processing head 103 in accordance with a perforation program by an NC system, not shown. Then, the cutter 108 executes spot facing up to a predetermined depth Kh, for instance, along an arrow 109 as shown in FIG. 5, though the cutting manner and cutting direction are discretionary, and the cutter spot-facing is terminated with the insulating layer of a predetermined thickness Rh left. See FIGS. 9 and 10.

Then, the XY table 102 moves, and the printed circuit board 101 is positioned in place for processing by the laser-beam processing head 104. An elongated or slender beam 110, which will be described in detail later, is emitted from the head 104 through a mask 111, and scanning with the beam is carried out in the direction of an arrow 112 in FIG. 6 to perform processing. When the insulating layer is removed up to the thickness Rh and the inner layer 6 is exposed, a wavelength detection sensor 113 detects the exposure. In this case, light 114 from the portion being processed changes from wavelength components indicative of the resin, ranging from visual light to infrared light, to wavelength components indicative of copper, ranging from ultraviolet light to visual light, and the sensor 113 detects the change. Spot facing is continued until the inner layer 6 is removed up to a thickness Lh or ½ the thickness Lh, and is then terminated. The thickness Lh is a perforating dimension for securely exposing the inner layer 6, and it is set to a value within the thickness of the inner layer 6. See FIGS. 11 and 12.

Figure 13:
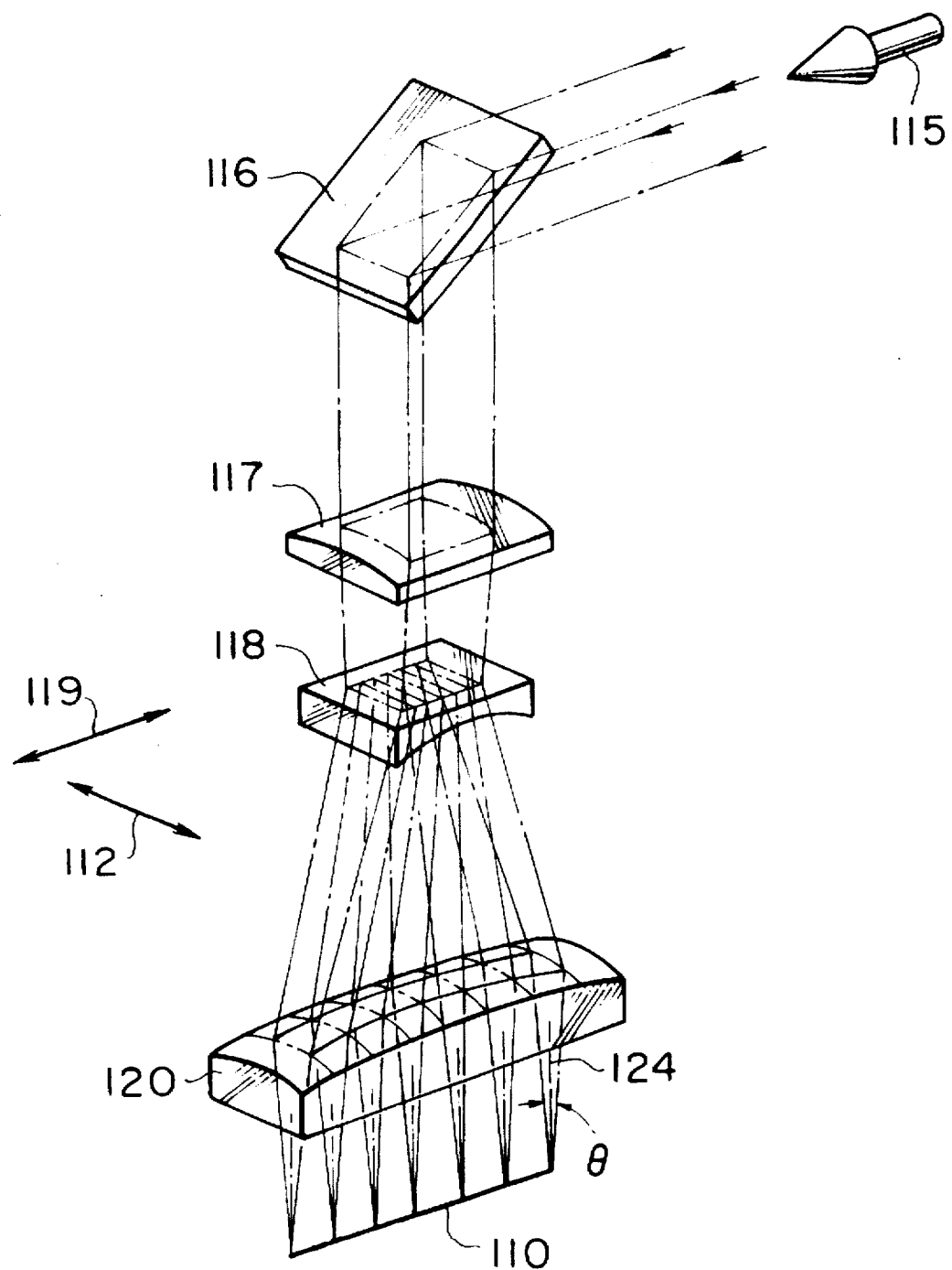
FIG. 13 is a perspective view schematically showing the optical system of the laser-beam processing head of the apparatus in FIG. 4.
Figure 14:
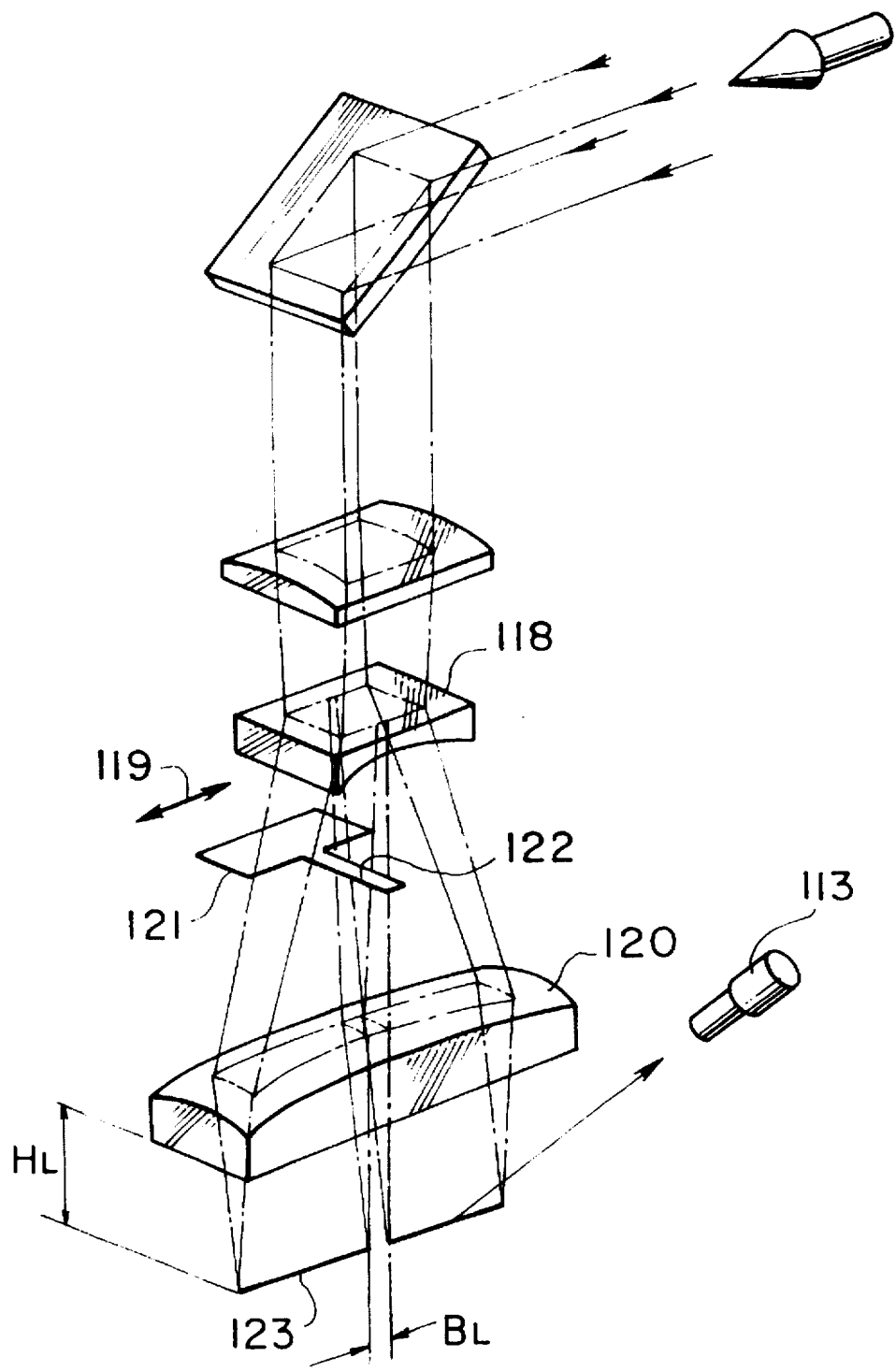
FIG. 14 is a schematic perspective view showing a modification of the optical system in FIG. 13.

FIGS. 13 and 14 show the arrangement of the optical system of the laser-beam processing head. In the drawings, reference numeral 115 denotes a rectangular beam of a generally square cross section, and 116 denotes a corner mirror. Reference numeral 117 denotes a convex cylindrical lens with a long focal length which contracts one side of the rectangular beam 115 in the direction of the arrow 112 to form a short side of the slender beam. Reference numeral 118 denotes a concave cylindrical lens for expanding another side of the rectangle in the direction of an arrow 119 to form the long side of the slender shape. Reference numeral 120 denotes a fθ lens which is formed of a three-dimensional convex cylindrical lens in a shape defined by combining a convex cylindrical lens, for imaging the beam further contracted in the direction of the arrow 112 and expanded in the direction of the arrow 119 into a slender shape so that the beam has an almost uniform energy density at the perforating position. In FIG. 14, reference numeral 121 denotes an interception element, 122 an intercepting portion of the element 121 provided for dividing the slender beam 110, and 123 a divided slender beam.

The above slender beam is formed by the optical system of the laser-beam processing head in the following manner. In the case of an excimer laser, the laser beam emitted from the electrode arrangement of the generator 105 of FIG. 4 is rectangular in cross section. The rectangular beam 115 expanded by a beam expander, not shown, is still rectangular even after the direction of the beam 115 is changed by the total reflection mirror 116 at the corner. The rectangular beam 115 is first contracted only in the arrow 112 direction of FIG. 6 by the convex cylindrical lens 117 with the long focal length though the beam on the arrow 119 side is left as it is. Passing through the concave cylindrical lens 118, the beam is expanded only at the arrow 119 side and becomes slender. The beam is finally further contracted at the arrow 112 side by the fθ lens 120. In the direction of the arrow 119, however, expansion of the beam by the concave cylindrical lens 118 is negated, and therefore, the beam is not expanded any more. Thus, the beam is imaged into the slender (elongated) shape so that the central line 124 of the beam is almost perpendicular to the surface to be processed and the beam has an almost uniform energy density at the processing position, that is, at the position separated by a distance HL separate from the fθ lens 120 in FIG. 15. In the embodiment of FIG. 14, the interception element 121 is set between the fθ lens 120 and the concave cylindrical lens 118. The slender beam is divided by the intercepting portion 122 in the direction of the arrow 119 at an interval BL and thus, the divided slender beam 123 is formed.

A temperature rise of the portion to be processed in laser-beam processing depends on several factors. Specifically, the factors include output characteristics such as a pulse peak value, pulse width, pulse shape, and pulse frequency of a laser, the area of a material to be perforated, and thermal physical values, such as laser beam absorption rate and thermal conductivity, of resin, glass, and copper which are the materials to be processed. In other words, when setting the output characteristics of a laser and the area of a material to be processed, an amount that the temperature of the processed portion rises depends on the stored quantity of heat due to the laser irradiation, that is, the sum of the laser-beam absorption quantity of heat and the diffusion quantity of heat, the latter of which is the sum of the quantity of heat transmitted away due to diffusion. This means that an almost-linear shape of the portion to be processed and a small processing thickness are advantageous to reduce thermal influence. During irradiation with a laser beam, the more the area to be irradiated with the laser beam increases and the shape of the portion to be irradiated is close to a square or circle, the more the portion being processed is subject to thermal influence, because the central portion of the portion being processed has a large stored quantity of heat and a large temperature rise. The same is applied to the thickness of a material to be perforated. Because a material has larger stored quantity of heat and larger temperature rise as its thickness increases, the portion being processed is liable to suffer from thermal influences. To the contrary, when the area to be irradiated with the laser is small or almost linear or the thickness of the material to be processed is small, the portion being processed is less subject to thermal influence, because the stored quantity of heat and the temperature rise decrease. Accordingly, the slender beam 110 is necessary in order to decrease thermal influence at the laser beam side. That is, to minimize thermal influence without changing the area to be simultaneously perforated, it is appropriate to form a slender beam having a proper length and a proper energy density and perform scanning at a proper pulse pitch and a proper feed rate in the direction of the arrow 112. The limit value of the slender beam is theoretically determined by the beam dimension, the focal length of a lens, and the wavelength of the laser beam. With the use of such a beam, the thermal conductivity ratio between the directions of the arrows 112 and 119 changes, the value of the maximum temperature rise of the portion being processed decreases, and oxidation of copper and carbonization of resin can greatly be improved. Because a high-density electronic part generates much heat, it is more advantageous in view of heat radiation that the part is in contact with a copper layer at an area as large as possible. Therefore, it is necessary to expose the copper foil layer inside a mounting surface of a printed circuit board. Further, it is effective in view of external noises to form a shielding layer nearby the high-density part when mounting the part on the printed circuit board. It is more effective for stabilization of signals to form the shielding layer at the bottom of the part.

Dividing of Slender Beam

According to the results from the present inventor's experiments, it is suitable to set the beam width in the direction of the arrow 112 where thermal influence is small, to 0.30 mm or less, more preferably to 0.10 mm or less. The beam width in the direction of the arrow 119 is geometrically determined by the energy density necessary for the portion to be processed, which depends on the output of a generator and the contraction rate of an optical system, and the beam width in the direction of the arrow 112. Although the beam width in the direction of the arrow 119 can be set to 100 mm or more, it is adequate to set the width to 3 to 20 mm, more preferably to 3 to 10 mm, in order to decrease thermal influence due to oxidation of copper and so forth. To decrease thermal influence by limiting a beam width to 3 to 10 mm, it is preferable to provide the interception element 121 between the concave cylindrical lens 118 and the fθ lens 120, so as to divide the rectangular beam 110 into the divided slender beams 123, and to move the dividing position of the beam for each scanning. Alternatively, it is possible to perform scanning while changing the dividing position by continuously reciprocating the interception element 121 in the direction of the arrow 119. Furthermore, the interception element 121 may alternatively be disposed between the convex cylindrical lens 117 and the concave cylindrical lens 118.

Energy Density at Portion to be Processed

According to experiences of the present inventor, in case of an excimer laser, the energy density of the rectangular beam 110 or divided slender beams 123, which smoothly removes resin and glass, damages the copper surface only a little and has less thermal influence, is 1.0 to 3.0 J/cm$^2$, more preferably 1.5 to 2.5 J/cm$^2$. When setting the energy density to 3 J/cm$^2$ or more, the amount temperature rise increases not only in the direction of the plane of the portion being processed but also in the direction of depth, and further, the thermal time constant increases. Therefore, carbonized resin and an oxidized copper surface are increased. Also in the case where the remaining thickness Rh of the insulating layer is as large as, for example, 60 μm or more, even if the energy density is approx. 2.0 J/cm$^2$, the thermal time constant in the depth direction and amount of the temperature rise increase. Therefore, carbonized resin and oxidized copper surface increase. According to values derived from the experiences of the present inventor, it is better to decrease the remaining thickness Rh of the resin at the portion to be processed, and the thickness is preferably 30 μm or less. In the case of a $CO_2$ laser, it is preferable to set the energy density to 0.02 to 0.5 J/cm$^2$.

Scanning Pulse Pitch and Scanning Rate

In the case of an excimer laser, when the pulse frequency is 100 to 500 Hz, a scanning pulse pitch having a decreased thermal influence on to the portion to be processed is 0.01 to 0.30 mm/pulse, more preferably 0.025 to 0.10 mm/pulse. Therefore, the scanning rate is 1.0 to 150 mm/sec, more preferably 2.5 to 25 mm/sec. Alternatively, it is possible to perform scanning by doubling the scanning pulse pitch and scanning rate, that is, setting the pitch to 0.02 to 0.60 mm and 2 to 300 mm/sec respectively, and shifting the pulse applying position by ½ the pulse pitch in the scanning direction each time. In the case of a $CO_2$ laser, it is preferable to set the pulse pitch to 0.1 to 0.3 mm/pulse.

Cutter Processing

Cutter processing is effective to minimize the remaining thickness of the resin at the portion to be processed. An error in the thickness of a printed circuit board is approx. 0.1 mm, and that of an insulting layer error is 30 μm. These errors are almost proportional to the plate thickness. Therefore, when the position of a target inner-layer is closer to the front surface of the printed circuit board than to the processing table surface, the errors can be minimized by setting a cutting depth on the basis of the board surface. On the other hand, when the inner layer is close to the back of the board, the errors can be minimized by setting a cutting depth on the basis of the processing table surface.

Control of Cutting Depth When Cutter Processing

The table height and the height of the circuit board surface at the processing position are measured by a height detection mechanism provided on the spot-facing head. When performing cutter perforation on the basis of the circuit board surface, the thickness of the portion to be processed is known from the difference between measured values of the board surface height and table height, and the perforation depth from the board surface is corrected by the difference between the actual board thickness and the design value at a constant rate. Also in case of cutter perforation on the basis of the perforation table surface, similar procedures are taken and the perforation depth is corrected at a constant rate from the bottom side of the board. In either case, the cutting depth is set so as to prevent an inner-layer conductor from being damaged by a cutter even when considering a correction value and an inner-layer-conduct or depth error of 30 μm. Also in the case of laser-beam perforation, the amount of a laser-beam perforation is corrected in accordance with the above constant-rate correction data.

Mechanical Portion of Optical System of Laser-beam Processing Head

Figure 15:
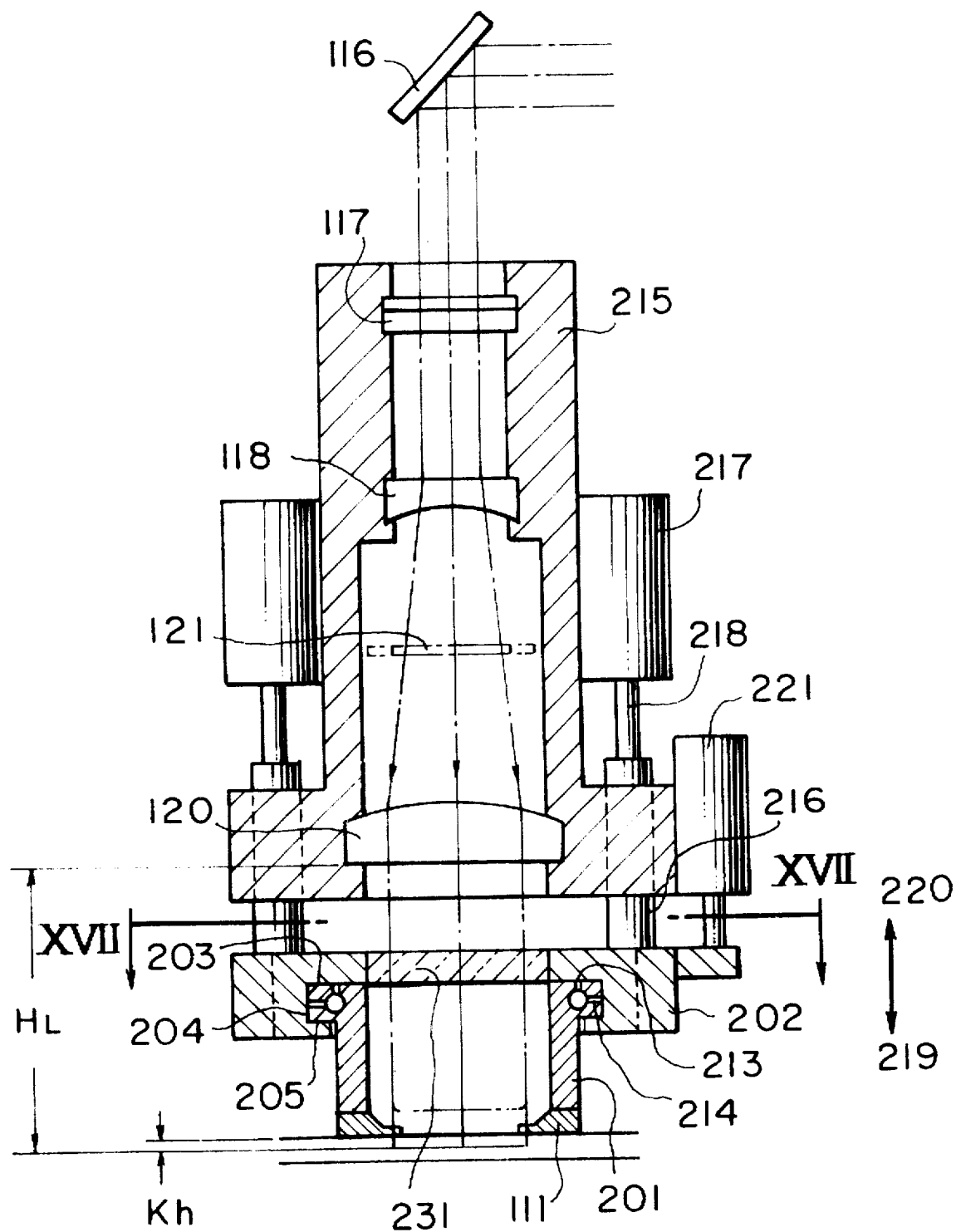
FIG. 15 is a sectional front view showing the mechanism of the laser-beam processing head of the apparatus in FIG. 4.
Figure 16:
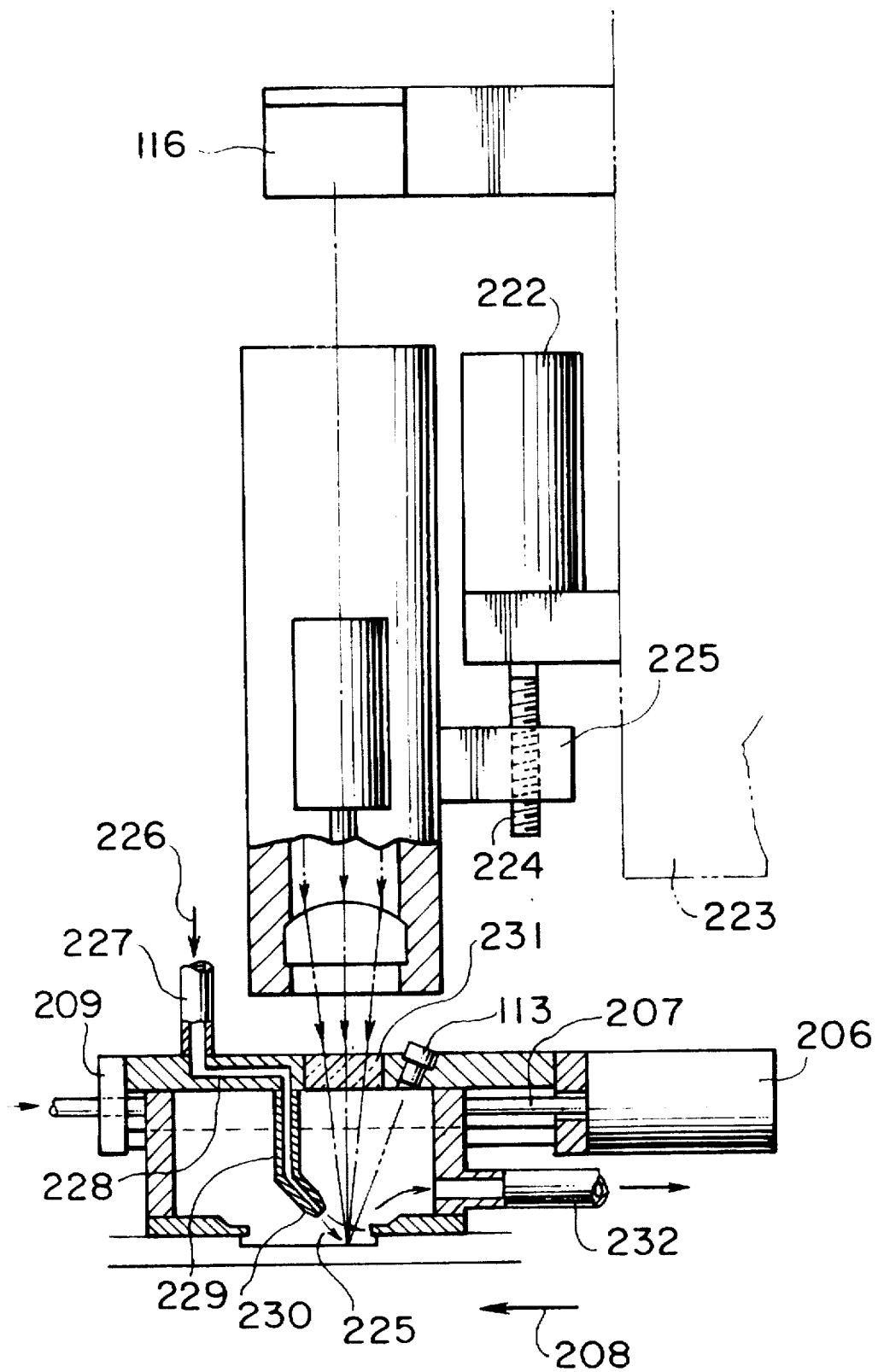
FIG. 16 is a partially sectioned side view of the laser-beam processing head mechanism in FIG. 15.
Figure 17:
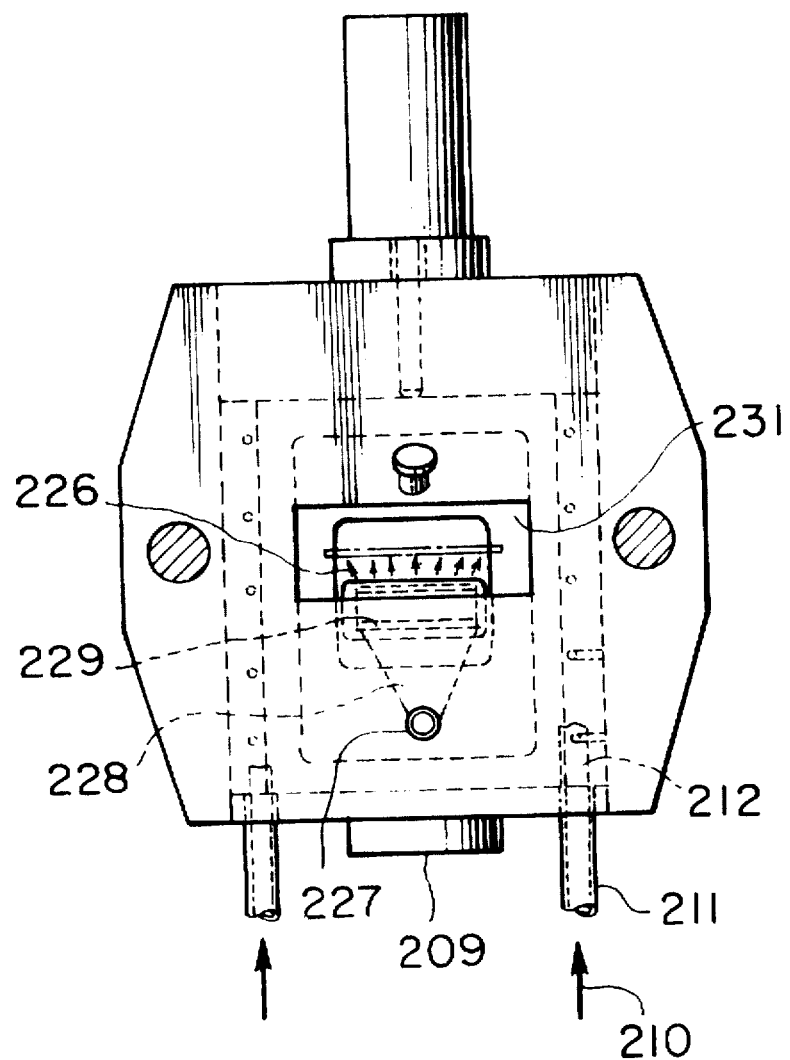
FIG. 17 is a sectional view taken along line XVII—XVII of FIG. 15.

Referring to FIGS. 15 to 17, the laser-beam processing head has a mechanical portion including a pressure foot 201. The pressure foot 201 has the mask 111 mounted on its bottom. The upper portion of the pressure foot is guided on a pressure foot holder 202 by a top air bearing guide plane 203, a side air bearing guide plane 204, and a bottom guide plane 205 to be mounted slidably in the direction of the arrow 112 in FIG. 6. The pressure foot 201, when driven in the setting direction, that is, in the direction of an arrow 208 in FIG. 16 by a cylinder rod 207 of a mask setting cylinder 206, comes into abutment against a stopper 209 so as to be situated at the start position for scanning. Air 210 for the air bearing is supplied to the guide planes 203 and 204 respectively through two fittings 211 and a supply hole 212 shown in FIG. 17 and through a top orifice 213 and a side orifice 214 shown in FIG. 15.

The pressure foot holder 202 is engaged with a lens body 215 through two guide rods 216, in which lens body the convex cylindrical lens 117, the concave cylindrical lens 118 and the fθ lens 120 are received. Connected with the respective guide rods 216 are cylinder rods 218 of clamping cylinders 217, and the pressure foot holder 202 can freely operate by means of the cylinders 217 in the direction of the optical axis, that is, the clamping direction of an arrow 219 and the lifting direction of an arrow 220. Reference numeral 221 denotes a position detector for detecting a change in the relative positions of the pressure foot holder 202 and the lens body 215. 222 denotes a driving motor fixed on a unit base 223, and 224 denotes a driving screw. The driving screw 224 engages with a nut 225 fixed on the lens body 215, which can perform positioning of the lens body 215 in the height direction by the driving of the motor 222.

Control of Processing Position HL

In operation, by a signal for preparation of processing, the cylinder rod 207 of the mask-setting cylinder 206 is driven in the setting direction of the arrow 208 in FIG. 16, and the pressure foot 201 is set at the scanning start position against the stopper 209. Then, the cylinder rods 218 of the clamping cylinders 217 are driven in the clamping direction of the arrow 219, and the pressure foot 201 presses and clamps the printed circuit board via the mask 111. The cylinders 217, when detecting a resistance by the printed circuit board, return the respective cylinder rods 218 in the direction of the arrow 220 so as to make its pressure against the printed circuit board adequate. At the same time, the position detector 221 detects the height of the pressure foot holder 202. The output of this detection is compared with a predetermined difference between HL and Kh, that is, the given difference between the height of the fθ lens 120 and the cutter spot-facing depth. In the case where the detection result differs from the predetermined difference, the height of the lens body 215 is automatically adjusted by an NC system, not shown, the driving motor 222, the driving screw 224 and the nut 225 so that the deviation between them becomes zero. Thus, the distance HL between the perforating surface and the fθ lens 120 is kept constant.

Function of Pressure Foot

When the clamping cylinders 217 are driven, the mask 111 is pressed against the printed circuit board through the pressure foot 201 and engages with the circuit board by a friction force. Substantially no friction force is produced between the pressure foot 201 and the pressure foot holder 202 because of the air bearing guide planes 203 and 204, and they smoothly slide on each other. Therefore, when the pressure foot holder 202 moves to scan with the beam in the direction of the arrow 112, the mask 111 does not come off the printed circuit board but it slides on the holder 202. Upon completion of the processing, the clamping cylinders 217 are driven in the direction of the arrow 220 and the mask 111 is lifted and moved to the next processing position.

Dimension and Shape of Mask

A Gaussian beam such as an excimer laser decreases in energy density in a direction away from the center of the beam. A low energy portion therefore appears at the beam boundary, and when performing perforation directly by such a beam, sagging easily occurs at the boundary. To perform perforation with a focal optical system which will greatly influence the quality of the boundary surface, it is better to use the metal mask 111 having an opening which is similar in shape to the portion to be processed but slightly smaller than a cutter spot-facing portion. In this case, the expression "slightly smaller" means, for example, that the opening is small by a portion shaded due to a focus draw angle θ of 3° to 8°, that is, by the sum of (Kh*tan θ)mm+(a value of 0.010 to 0.025 mm) in the direction of the arrow 112 and by a value of 0.010 to 0.025 mm in the direction of the arrow 119. Carrying out perforation with the mask 111 set on the upside of the printed circuit board, corners 14 of the perforated portion are sharply finished without damaging sides 13 thereof because the beam boundary is interrupted by the mask. Accordingly, a sharp perforation boundary is obtained even when the corners 14 of the perforated portion are rounded due to processing by an abraded cutter.

Prevention of Copper Surface of Printed Circuit Board from Oxidation

Oxidation of the copper surface is caused by free oxygen which is produced when the resin, an organic material, is decomposed and the free oxygen combines with the heated copper. Oxidation of the copper surface of a printed circuit board can be prevented by using Ar+H2 as a reducing agent during laser-beam processing. When the energy density is 3 J/cm$^2$ or higher, oxidation can be prevented by performing laser-beam processing in an inert gas atmosphere. In FIGS. 16 and 17, reference numeral 226 denotes a reducing or shielding gas which is supplied to the processing portion from a nozzle 230 through a fitting 227 and passages 228 and 229. Reference numeral 231 denotes a window for a shielding effect and for protection of the lens, which allows the laser beam to pass therethrough, and 232 denotes a vacuum hole for collecting materials scattered due to the processing.

Multiple Laser-beam Processing Heads

Figure 18:
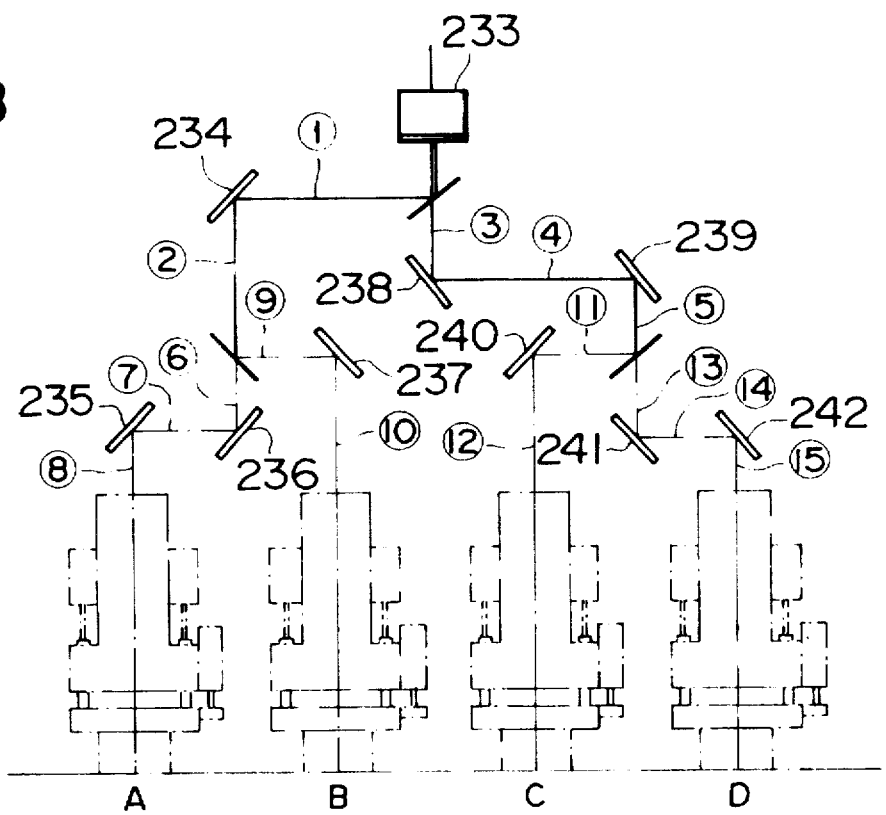
FIG. 18 is a schematic view of an essential portion of the processing apparatus of another embodiment of the present invention, showing an optical system for sending uniform beams to multiple laser-beam processing heads.
Figure 19:
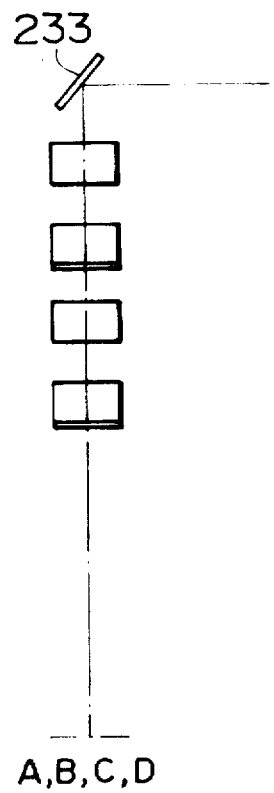
FIG. 19 is a schematic side view of the optical system in FIG. 18.

In a case of multiplexing the apparatus by dividing one laser beam into a plurality of laser-beam processing heads, it is difficult to obtain the same beam size at the respective processing positions of the heads because the laser beam has a slight angle of aperture. FIGS. 18 and 19 show an example of an optical system for providing a uniform beam size at each processing position by equalizing the lengths of optical paths up to the respective processing position. In FIGS. 18 and 19, reference numerals 233 to 242 denote total reflection mirrors, and 243 to 245 denote half mirrors for passing 50% of a laser beam. In this optical system, the distances from the mirror 233 to respective processing positions A, B, C, and D are made the same by equalizing the lengths of optical paths (1) and (4), (7) and (9), and (11) and (14). Although the example of four axes has been illustrated here, the described measure is equally applicable to two or more even-number axes.

Control of Scan Frequency

In the case of multiplex heads, the temporal deviation in detection of wavelength detection sensors 113 increases when the remaining quantities Rh of the resin greatly fluctuates at the respective portions being processed. As a result, the removal quantity at each processing head fluctuates and over-removal may occur. To prevent such over-removal, it is necessary to provide a beam shutter, not shown, for every processing head, that is, to set the beam shutters at a position after the optical path (6) for the processing position A, at a position after the optical path (9) for the processing position B, at a position after the optical path (11) for the processing position C, and at a position after the optical path (13) for the processing position D, respectively. Each shutter is closed after the wavelength detection sensor 113 for the corresponding head detects a change of wavelength components and after scanning is continued for the thickness Lh which has been described above.

Although the present invention has been described on the basis of the specific embodiments, the invention is not limited solely to such specific forms, and various changes and modifications may be made without deviating from the scope of the appended claims. Some of such changes and modifications will be exemplified below.

Figure 20:
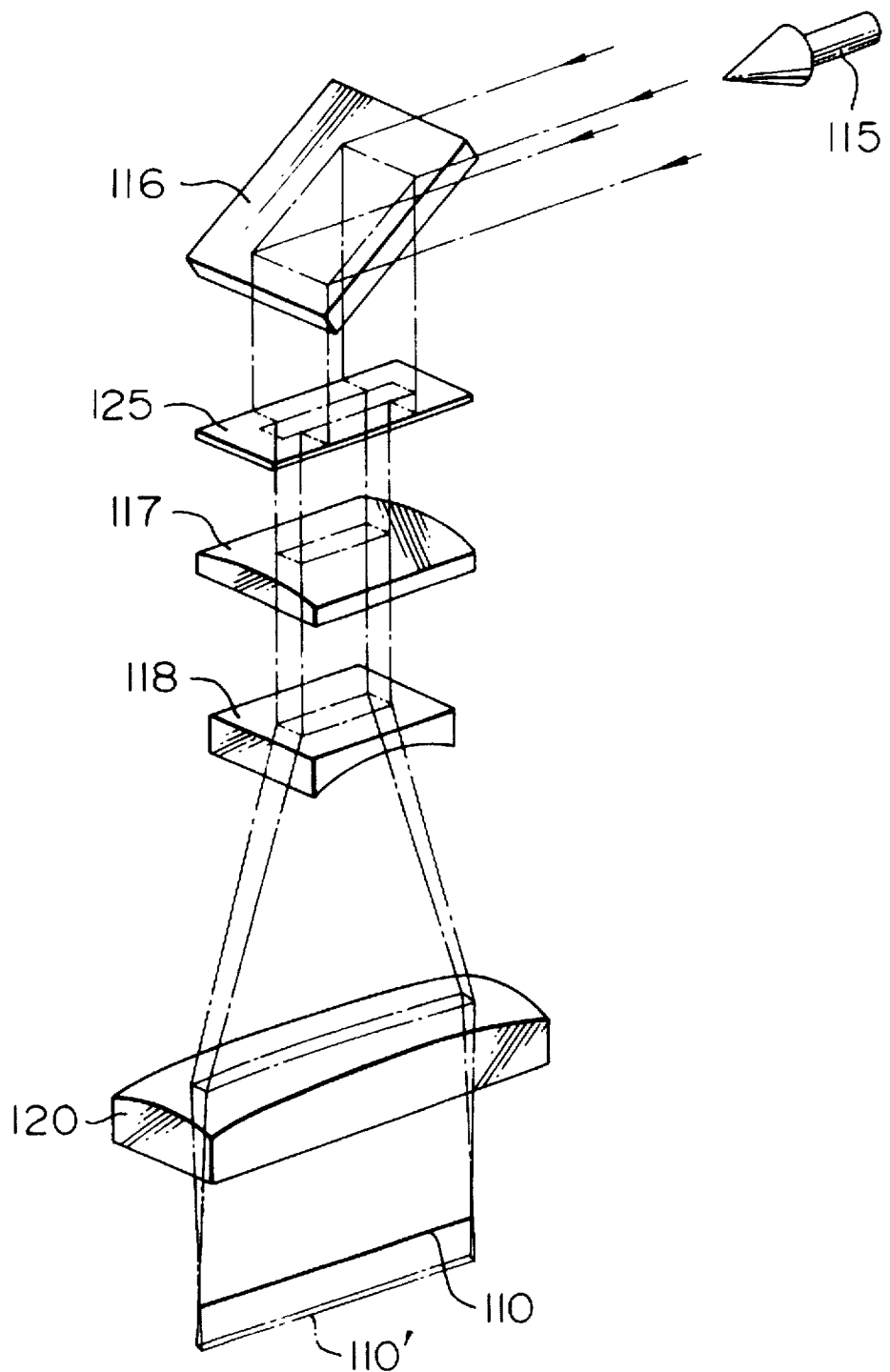
FIG. 20 is a schematic view showing an alternative of the laser-beam processing head optical system used for the processing apparatus of FIG. 4.

1. It is not necessary to mount the cutter processing head and the laser-beam processing head on the same apparatus but they may be disposed separately.
2. Although the embodiments employ an excimer laser, a $CO_2$ laser may be used instead of the excimer laser.
3. A perforation method to which the present invention is applied may be a conformal masking method using a focal optical system, which is superior in energy density, or a mask imaging method using a step-and-repeat optical system, which is superior in resolution. Such a step-and-repeat optical system is illustrated in FIG. 20. The modification shown in FIG. 20 employs an imaging mask 125, having an elongate opening, in addition to the components of the embodiment of FIG. 13, to form a slender beam 110' which is wider than the beam 110.
4. The illustrated printed circuit board has no copper foil on the outer laser surface, but the present invention is, of course, also applicable to a printed circuit board having a copper foil on its outer surface.
5. In the embodiment, the fθ lens 120 has functions both of forming a slender beam and making the energy density thereof uniform. However, it is also possible to fulfill these functions with separate components respectively. For example, it is possible to provide the same functions by making the lens 117 two-dimensional so that the contraction rate of a beam in the direction of the arrow 112 increases at the center and decreases at the both ends, and by simultaneously making the lens 120 two-dimensional.
6. In the case where the length of a desired slender beam is small in the direction of the arrow 119, that is, when a difference of beam width is small between the positions of the lenses 117 and 120, the lens 118 may be omitted.
7. Although the mask 111 has been described as being integrated with the apparatus, alternatively, an overlay-type mask may be set fixedly at a position of a circuit board to be spot-faced, separately from the apparatus. In this overlaying method, the mask is previously fixed onto the printed circuit board and a laser beam is applied over the mask during processing. Therefore, a process for attaching or detaching the mask to or from the printed circuit board is unnecessary at the time when performing the laser-beam machining.

The spot facing according to the method and apparatus of the present invention has the following advantages and realizes products which the conventional art has not been able to provide so far.

1. The following quality is stably achieved even after the perforating process, the plating process, or the pattern forming process. Therefore, the product yield, which has been approx. 70% so far, is greatly improved, for example, up to 0.1% or less in fraction defective.
   * No residue of glass or resin of the insulating layer is left on the surface of the external-connection conductor terminals 2 of the inner layer.
   * Such burr as produced when the processing is performed only by a cutter is not found at all on the external-connection conductor terminals 2 and the chip mounting conductor terminal 6.
   * It is desirable that positions of the terminals 2 and 6 are higher than the resin surface 12 by 0 to 80% of the thickness of the conductor layer. The processing according to the invention makes it possible to easily realize such positions.
   * There is no damage on the sides 13 of the spot-faced portion due to the processing.
2. The time required for the processing of the present invention is shortened up to approx. ⅔ the time required for the conventional machining with a cutter alone.

A cutting depth, which can be realized by cutter spot-facing, is on the order of mm and a desired spot-facing depth can be ensured by the processing of one cycle. Taking the case where a square with one side of 20 mm is to be spot-faced by a cutter with a diameter of 2.0 mm, the cutter feed speed does not need setting to a finishing rate, and the feed speed can be set to 1.0 m/min which is a coarse perforation rate. The time required for the cutter spot-facing is 30 sec.

Meanwhile, in the case of an excimer laser, the removal quantity per pulse is on the order of 1 μm. For example, when there is resin residue with a thickness of 30 μm, a scanning of 30 cycles is necessary to remove the residual resin. In this case, assuming the pulse frequency as 200 Hz and the scanning rate as 20 mm/sec, scan of one cycle requires 1 sec, and the time required to complete the laser-beam processing is 30 sec. Therefore, the total time required for the processing of the present invention comes to 60 sec. In contrast to the above, in the case of the convention processing only with a cutter, coarse perforation requires 30 sec and finishing perforation requires 60 sec, and therefore, a total of 90 sec is necessary.

3. The service life of a cutter is greatly increased and the running cost decreases to 1/5 to 1/10.

The processing according to the present invention does not need to remove the inner-layer copper foil by a cutter, as is necessary in the conventional processing performed with a cutter alone, and wear or abrasion of the cutter is 1/5 or less as compared with the conventional art. Further, even if the cutter is worn, it has substantially no influence on the final quality of the processed portion. Therefore, it is possible to prolong the service life of a cutter approx. five-fold by adjusting a cutting depth in view of abrasion of the cutter end. The cost of laser gas occupying most of the running cost of the processing according to the present invention is low as compared with that of a cutter. Moreover, as it is possible to supply a laser beam to a plurality of heads by dividing the output of a generator, the cost can further be decreased.

What is claimed is:

1. A method for spot-facing a printed circuit board having an insulating material and at least one inner-layer conductor embedded in the insulating material, to expose an area of an inner-layer conductor, comprising the steps of:

removing the insulating material of an area corresponding to the area of the inner-layer conductor to be exposed, by horizontally moving a mechanical cutter relative to the printed circuit board, said insulating material being removed up to a position just above the inner-layer conductor to leave a remaining part of the insulating material above the inner-layer conductor, said remaining part of the insulating material having a thickness smaller than a thickness of the insulating material removed by the mechanical cutter; and removing said remaining part of the insulating material through scanning with a laser beam to expose the inner-layer conductor, said laser beam having an elongated shape substantially perpendicular to a direction of scanning of the laser beam and having an almost uniform energy density along the elongated shape.

2. The method according to claim 1, further comprising the step of overlaying a mask on the printed circuit board before removing the remaining part of the insulating material with the laser beam, wherein said mask has an opening overlying the area of the inner-layer conductor to be exposed.

3. The method according to claim 2, wherein the laser beam is converted into the elongated shape through a focal optical system and the mask is a conformal mask.

4. The method according to claim 2, wherein the laser beam is converted into the elongated shape through an image optical system and the mask is an imaging mask.

5. The method according to claim 1, wherein the laser beam is a $CO_2$ laser, an energy density of the laser at said remaining part is 0.02 to 0.5 J/cm$^2$, a pulse pitch is 0.1 to 0.3 mm/pulse, and a pulse width is 1 ms or less.

6. The method according to claim 1, wherein the laser beam is an excimer laser, an energy density of the laser at said remaining part is 1.0 to 2.5 J/cm$^2$, a pulse pitch is 0.01 to 0.3 mm/pulse, and a pulse width is 1 ms or less.

7. The method according to claim 2, wherein said mask is a contact mask and an area of said opening of the mask is smaller than the area of the insulating material removed by the mechanical cutter and intercepts a periphery of the laser beam.

8. The method according to claim 1, wherein the laser beam is locally interrupted by an interception element to be in an elongated shape which is broken off at an intermediate position thereof, so that temperature at a portion to be processed of the circuit board is uniformly raised.

9. The method according to claim 1, wherein the scanning with the laser beam is continued until a part of the inner-layer conductor is removed to ensure exposure of the inner-layer conductor.

10. The method according to claim 1, wherein said laser beam is formed from a single laser beam of a substantially rectangular cross section, through at least one lens, into said elongated shape.

11. The method according to claim 1, wherein the laser beam has a central line which is substantially perpendicular to an exposed surface of the remaining part of the insulating material.

12. The method according to claim 1, wherein the elongated shape has a width dimension and a length dimension, the width dimension being smaller than the length dimension, the width dimension being at most 0.3 mm and the length dimension being 3 to 20 mm.

13. The method according to claim 1, wherein said remaining part has a thickness of at most 30 μm.

14. The method according to claim 1, wherein said inner-layer conductor which is exposed has a length and width such that an electrical component can be mounted thereon.

15. The method according to claim 14, wherein the electrical component is an LSI chip.

* * * * *